(12) United States Patent
Liu et al.

(10) Patent No.: US 7,518,429 B2
(45) Date of Patent: Apr. 14, 2009

(54) DELAY CIRCUIT

(75) Inventors: Bai-Hong Liu, Shenzhen (CN); Ze-Shu Ren, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/767,478

(22) Filed: Jun. 23, 2007

(65) Prior Publication Data

US 2008/0218236 A1 Sep. 11, 2008

(30) Foreign Application Priority Data

Mar. 8, 2007 (CN) .................. 2007 2 0200127 U

(51) Int. Cl.
*H03H 11/26* (2006.01)

(52) U.S. Cl. .................. 327/261; 327/264; 327/268; 327/552

(58) Field of Classification Search .................. None
See application file for complete search history.

(56) References Cited

U.S. PATENT DOCUMENTS

| | | | | |
|---|---|---|---|---|
| 4,430,587 A | * | 2/1984 | Tennyson | .................. 327/281 |
| 4,746,823 A | * | 5/1988 | Lee | .............................. 327/262 |
| 6,940,333 B2 | * | 9/2005 | Chiu et al. | .................. 327/333 |

* cited by examiner

*Primary Examiner*—An T Luu
(74) *Attorney, Agent, or Firm*—Frank R. Niranjan

(57) ABSTRACT

A delay circuit (12) includes a resistor (R1), a capacitor (C), and a discharging circuit (14). The discharging circuit includes a PNP transistor (Q1) and an NPN transistor (Q2). The capacitor has one terminal connected to one terminal of the resistor, and the other terminal connected to ground. The PNP transistor has a base connected to the other terminal of the resistor, a collector, and an emitter connected to a voltage source. The NPN transistor has a base connected to the collector of the PNP transistor, an emitter connected to ground, and a collector connected to the one terminal of the resistor.

3 Claims, 4 Drawing Sheets

DELAY CIRCUIT

Relevant subject matter is disclosed in co-pending U.S. Patent Applications entitled "TIME DELAY CIRCUIT", assigned to the same assignee with this application.

BACKGROUND OF THE INVENTION

1. Field of the Invention

The present invention relates to delay circuits, and more particularly to a delay circuit including a resistor and a capacitor.

2. Description of Related Art

FIG. 1 shows an example of a conventional delay circuit, which has an input terminal 10 and an output terminal 11. The input terminal 10 is connected to a gate G of an N-channel MOS transistor Q11 via a delay circuit. The delay circuit is composed of a resistor R11 and a capacitor C11. A drain D of the N-channel MOS transistor Q11 is connected to a node 13 via a resistor R12. The node 13 is at high level. The drain D of the N-channel MOS transistor Q11 is connected to the output terminal 11. A source S of the N-channel MOS transistor Q11 is connected to ground.

Referring to FIG. 2, at t=T1a, a signal at the input terminal 10 changes from a low level to a high level. The capacitor C11, which is connected to the input terminal 10, charges. The voltage at the gate G of the N-channel MOS transistor Q11 gradually rises with the charging of the capacitor C11. A signal at the output terminal 11 is high. At t=T2a, the gate voltage of the N-channel MOS transistor Q11 is 2 (V), which turns on the N-channel MOS transistor Q11. At this time, the signal at the output terminal 11 become low. The voltage level change of the signal at the output terminal 11 is delayed by (T2a–T1a) compared to the voltage level change of the signal at input terminal 10. At t=T3a, the signal at input terminal 10 changes from high to low. At this time, the capacitor C11, discharges. The voltage at the gate G of the N-channel MOS transistor Q11 gradually drops with the discharging of the capacitor C11. At t=Ta4, the gate voltage of the N-channel MOS transistor Q11 will be below 2 (V), which will turn off the N-channel MOS transistor Q11. The voltage level change of the signal at the output terminal 11 is delayed by (T4a–T3a) compared to the voltage level change of the signal at the input terminal 10. However, in some circuits, users need to discharge the capacitor immediately.

What is needed, therefore, is a delay circuit which can discharge the capacitor immediately.

SUMMARY OF THE INVENTION

A delay circuit comprises a resistor, a capacitor, a PNP transistor, and an NPN transistor. The capacitor has one terminal connected to one terminal of the resistor, and the other terminal connected to ground. The PNP transistor has a base connected to the other terminal of the resistor, a collector, and an emitter connected to a voltage source. The NPN transistor has a base connected to the collector of the PNP transistor, an emitter connected to ground, and a collector connected to the one terminal of the resistor.

Other advantages and novel features of the present invention will become more apparent from the following detailed description of preferred embodiment when taken in conjunction with the accompanying drawings, in which:

DETAILED DESCRIPTION OF THE INVENTION

Figure 1:
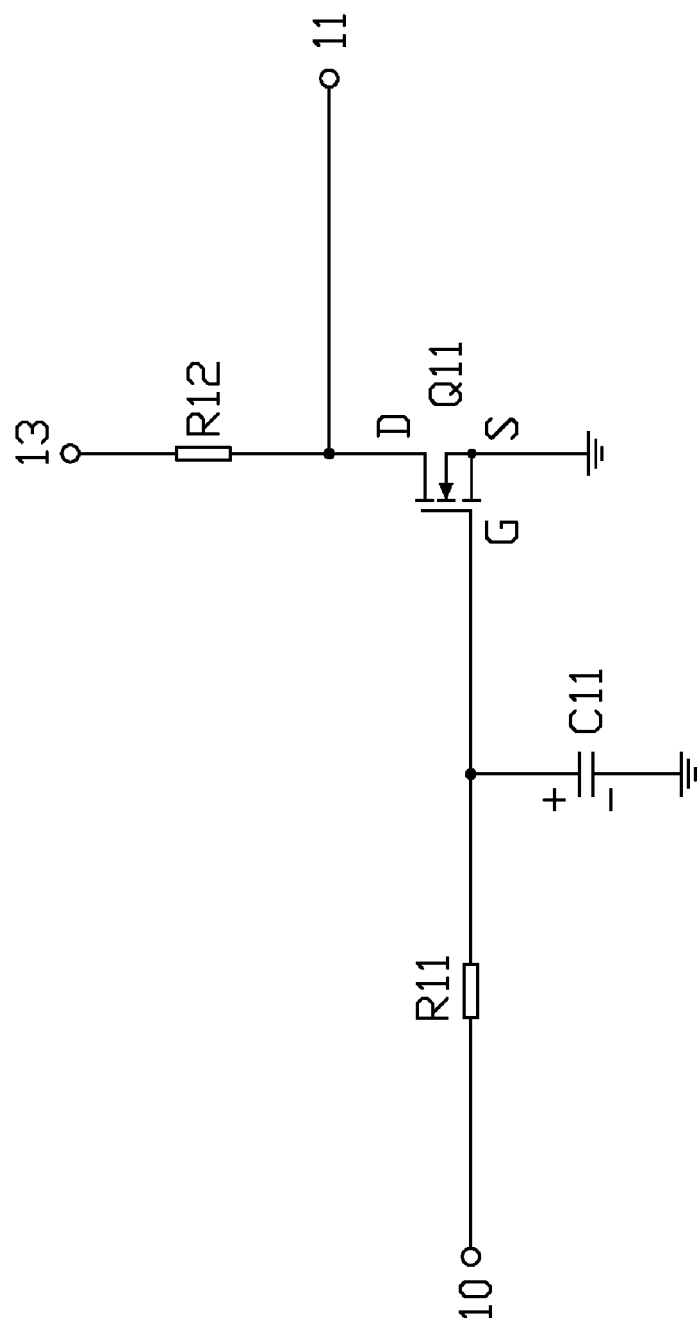
FIG. 1 is a diagram of a conventional delay circuit applied in a circuit.
Figure 2:
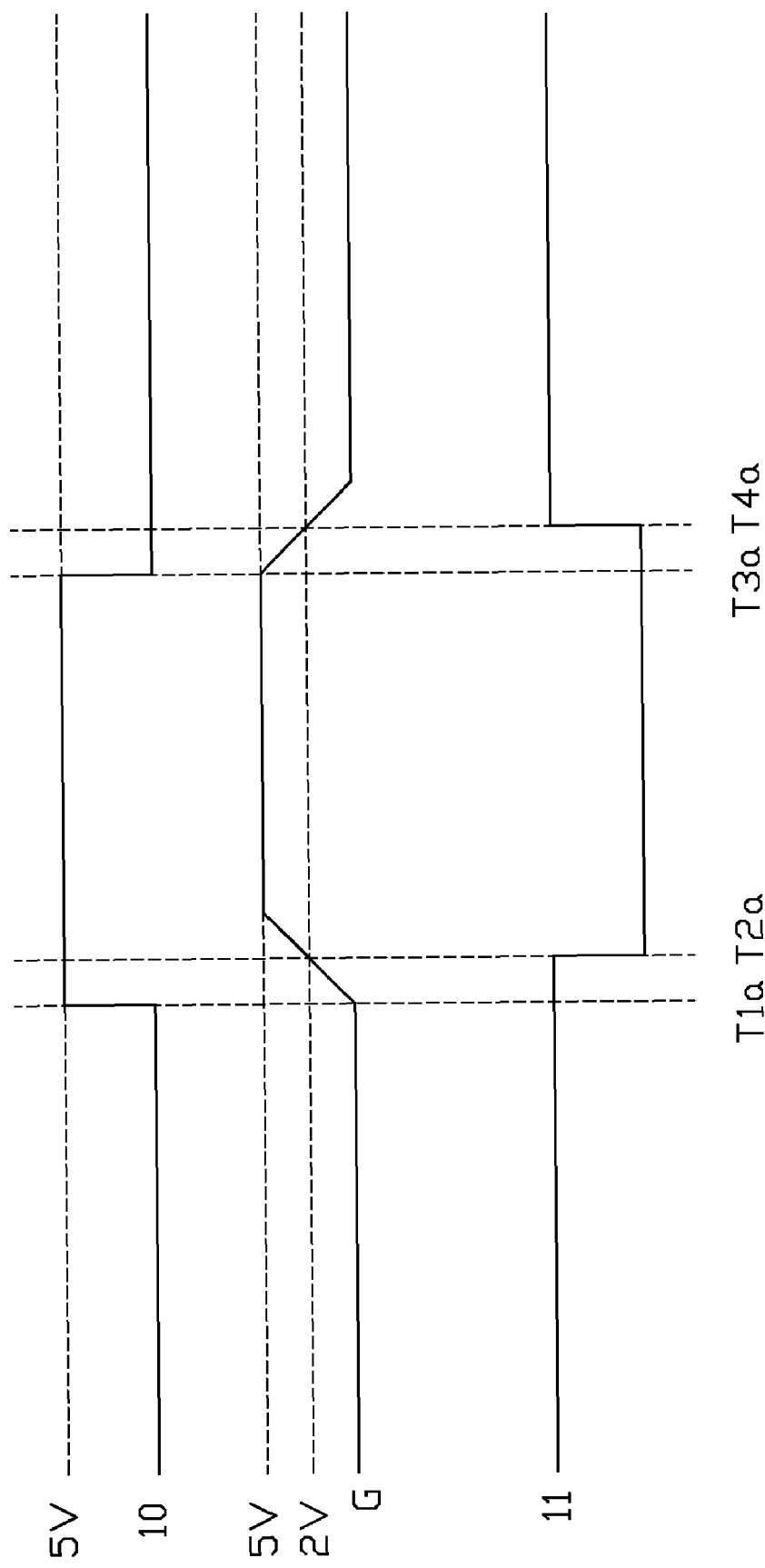
FIG. 2 is a sequence diagram of signals at an input, an output, and a gate of an MOS transistor in FIG. 1.
Figure 3:
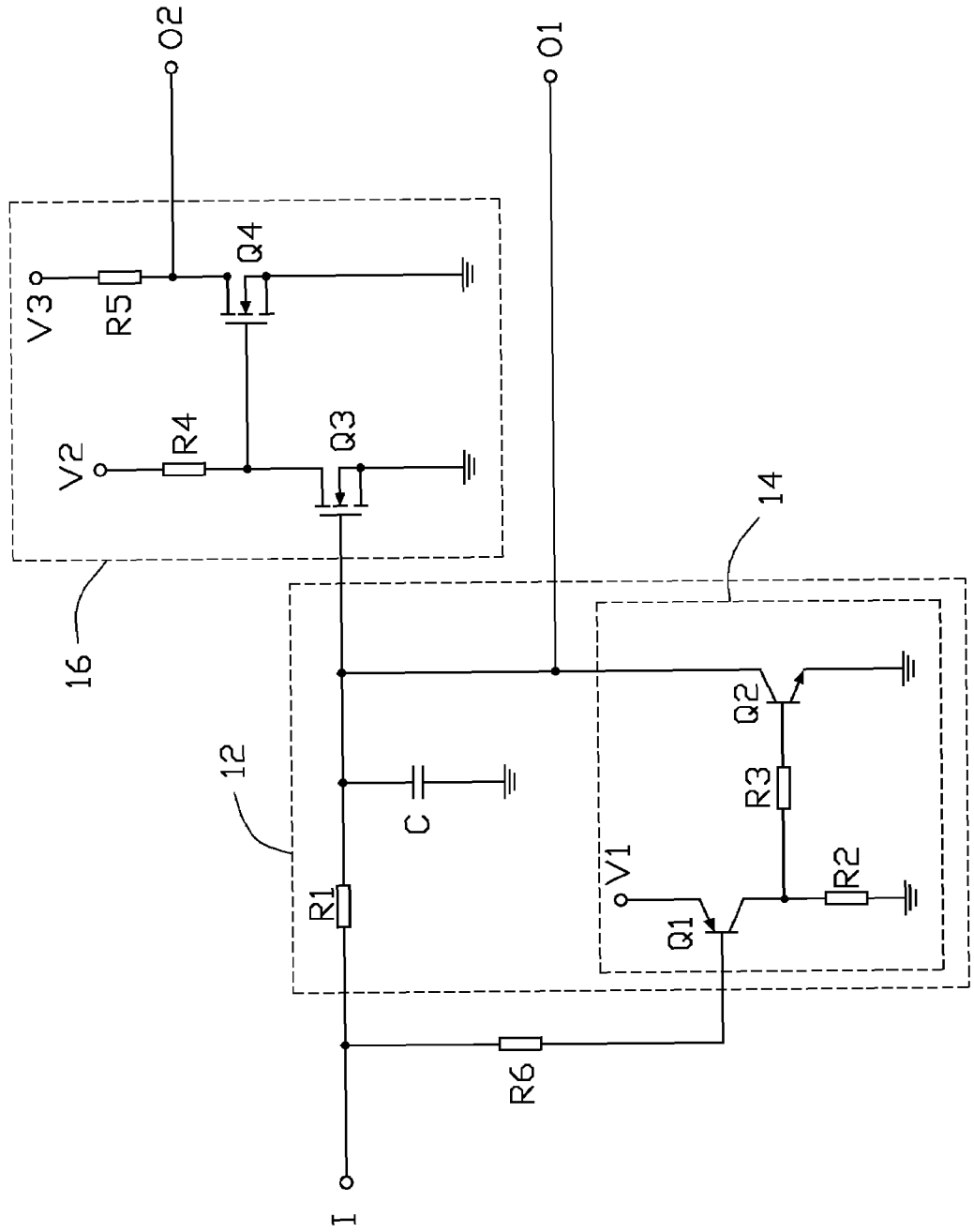
FIG. 3 is a diagram of a delay circuit applied in a circuit in accordance with a preferred embodiment of the present invention.

Referring to FIG. 3, a delay circuit of an embodiment of the present invention applied in a circuit includes an input terminal I and two output terminals O1, O2. The input terminal I is connected to an adjusting circuit 16 via a delay circuit 12.

The delay circuit 12 includes a resistor R1, a capacitor C, and a discharging circuit 14. One terminal of the resistor R1 is connected to the input terminal I, and the other terminal of the resistor R1 is connected to one terminal of the capacitor C. The other terminal of the capacitor C is connected to ground.

The discharging circuit 14 includes a PNP transistor Q1 and an NPN transistor Q2. A base of the PNP transistor Q1 is connected to the input terminal I via a resistor R6. An emitter of the PNP transistor Q1 is connected to a voltage source V1. A collector of the PNP transistor Q1 is connected to ground via a resistor R2. The collector of the PNP transistor Q1 is connected to a base of the NPN transistor Q2 via a resistor R3. A collector of the NPN transistor Q2 is connected to the other terminal of the resistor R1. An emitter of the NPN transistor Q2 is connected to ground.

The adjusting circuit 16 includes two N-channel MOS transistors Q3, Q4. The N-channel MOS transistor Q3 includes a gate connected to the other terminal of the resistor R1, a source connected to ground, and a drain connected to a voltage source V2 via a resistor R4. The N-channel MOS transistor Q4 includes a gate connected to the drain of the N-channel MOS transistor Q3, a source connected to ground, and a drain connected to a voltage source V3 via a resistor R5 and to the output O2.

Figure 4:
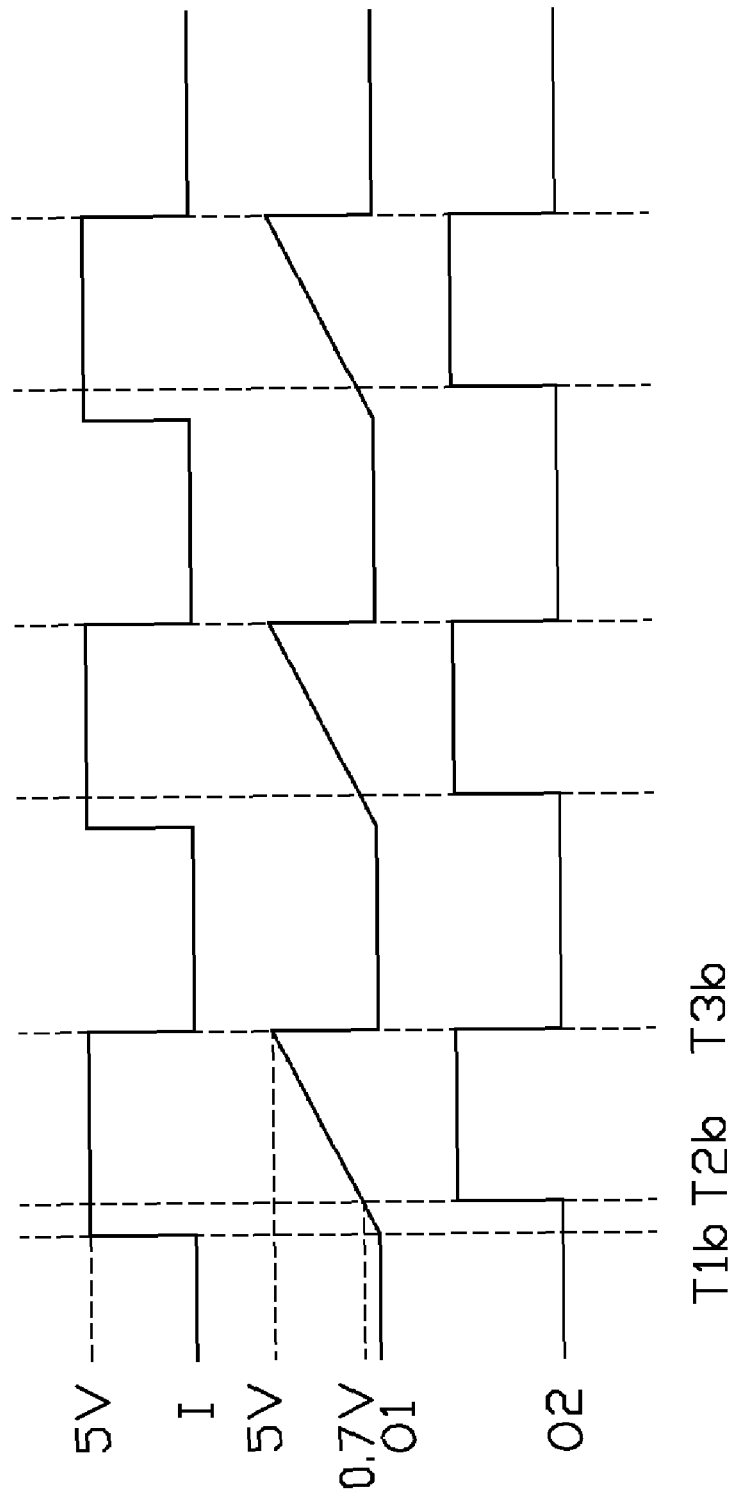
FIG. 4 is a sequence diagram of signals at an input and two outputs in FIG. 3.

Referring also to FIGS. 3 and 4, at t=T1b, a signal at the input terminal I goes from low to high level. The base of the PNP transistor Q1, which is connected to the input terminal I, is high turning off the PNP transistor Q1. The capacitor C, which is connected to the input terminal I, charges. The N-channel MOS transistor Q3 is off and Q4 is on. Signal at the output terminals O1, O2 are low. The voltage at the output terminal O1 gradually rises with the charging of the capacitor C. At t=T2b, the voltage at the output terminal O1 is 0.7 (V) turning on the N-channel MOS transistor Q3, thus, the gate of the N-channel MOS transistor Q4, which is connected to the drain of the N-channel MOS transistor Q3, is low turning off the N-channel MOS transistor Q4. The signal at the output terminal O2 becomes high. The signal at the output terminal O2 is delayed by (T2b–T1b) compared to the signal at the input terminal I. At t=T3b, the input terminal I goes from high to low level. The base of the PNP transistor Q1, connected to the input terminal I, is low turning on the PNP transistor Q1. The base of the NPN transistor Q2 connected to the collector of the PNP transistor Q1 is high turning on the NPN transistor Q2. The capacitor is discharged immediately by the NPN transistor Q2. The voltage at the output terminal O1 and the gate of the N-channel MOS transistor Q3 drops immediately, turning off the N-channel MOS transistor Q3. At this time, the gate of N-channel MOS transistor Q4 connected to the drain of N-channel MOS transistor Q3 is high, turning on the N-channel MOS transistor Q4. The output terminal O2 is low. The output terminal O2 has no delay compared to the input terminal I.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A delay circuit, comprising:
   an RC circuit comprising a resistor having one end configured for receiving an input signal and an opposite end, and a capacitor connected to the opposite end of the resistor
   a discharging circuit connected to the RC circuit for controllable discharging of the capacitor, the discharging circuit comprising a controllable current path connected between the capacitor and ground, and a control terminal connected to the one end of the resistor configured for sensing a status of the RC circuit to control conduction of the path, the discharging circuit comprises a PNP type transistor and an NPN type transistor, a base of the PNP type transistor acts as the control terminal, an emitter of the PNP transistor is connected to a high level voltage signal, a collector of the PNP type transitor is connected to ground via a resistor, a base of NPN type transistor is connected to the collector of the PNP type transistor, a collector of the NPN type transistor is connected to the capacitor, and an emitter of the NPN type transistor is connected to ground;
   wherein when the control terminal senses the RC circuit starts charging, the control terminal closes the path such that the capacitor charges gradually, and when the control terminal senses the RC circuit starts discharging, the control terminal opens the path to quickly discharge the capacitor.

2. A sequence circuit, comprising:
   a resistor, one terminal of the resistor connected to an input terminal, the other terminal of the resistor connected to a first output terminal;
   a capacitor having one terminal connected to the other terminal of the resistor, and the other terminal connected to ground;
   a discharging circuit having a terminal connected to the one terminal of the resistor, another terminal connected to the other terminal of the resistor, the discharging circuit comprising a PNP transistor and a NPN transistor, the PNP transistor having a base connected to the one terminal of the resistor, a collector, and an emitter connected to a voltage source, the NPN transistor having a base connected to the collector of the PNP transistor, an emitter connected to ground, and a collector connected to the other terminal of the resistor; and
   an adjusting circuit with a terminal connected to the other terminal of the resistor, and another terminal connected to a second output terminal,
   wherein when a sequence signal applied at the input terminal goes from low to high level, the voltage at the first output terminal gradually rises with charging of the capacitor and the change of the voltage level of the signal at the second output terminal is delayed a predetermined time compared to the change of the voltage level of the signal at the input terminal; when the signal at the input terminal goes from high to low level, the capacitor discharges via the discharging circuit in such a manner that the voltage at the first output terminal drops immediately and, the change of the voltage level of the signal at the second output terminal is substantially synchronous with the signal at the input terminal.

3. The sequence circuit as described in claim 2, wherein the adjusting circuit comprises a first N-channel MOS transistor and a second N-channel MOS transistor, the first N-channel MOS transistor having a gate connected to the other terminal of the resistor, a source connected to ground, and a drain connected to first voltage source via a resistor, the second N-channel MOS transistor having a gate connected to the drain of the first N-channel MOS transistor, a source connected to ground, and a drain connected to a second voltage source via a resistor and to the second output terminal.

* * * * *